United States Patent
Krishnaswamy et al.

(10) Patent No.: US 11,171,613 B1
(45) Date of Patent: Nov. 9, 2021

(54) METHODS AND APPARATUS FOR USING SIGNAL PRE-DISTORTION WITH INDIVIDUAL POWER AMPLIFIER (PA) CONTROL

(71) Applicant: Mixcomm, Inc., Chatham, NJ (US)

(72) Inventors: Harish Krishnaswamy, New York, NY (US); Frank Lane, Easton, PA (US); Arun Natarajan, Corvallis, OR (US); Aristotele Hadjichristos, San Diego, CA (US); Vikas Vinayak, Menlo Park, CA (US)

(73) Assignee: Mixcomm, Inc., Chatham, NJ (US)

( * ) Notice: Subject to any disclaimer, the term of this patent is extended or adjusted under 35 U.S.C. 154(b) by 0 days.

(21) Appl. No.: 16/917,892

(22) Filed: Jun. 30, 2020

Related U.S. Application Data

(60) Provisional application No. 63/042,533, filed on Jun. 22, 2020.

(51) Int. Cl.
| | |
|---|---|
| *H03F 1/32* | (2006.01) |
| *H03F 3/24* | (2006.01) |
| *H03F 1/02* | (2006.01) |
| *H04B 1/40* | (2015.01) |

(52) U.S. Cl.
CPC ............. *H03F 1/3241* (2013.01); *H03F 1/02* (2013.01); *H03F 3/245* (2013.01); *H04B 1/40* (2013.01); *H03F 2200/451* (2013.01); *H03F 2201/3215* (2013.01)

(58) Field of Classification Search
CPC .......... H03F 1/3241; H03F 1/02; H03F 3/245; H03F 2200/451; H03F 2201/3215; H04B 1/40

USPC ...................... 455/114.3, 73, 67.13; 375/296
See application file for complete search history.

(56) References Cited

U.S. PATENT DOCUMENTS

| | | | | |
|---|---|---|---|---|
| 7,415,252 | B2 * | 8/2008 | Jelonnek ............... | H03F 1/3247 455/114.2 |
| 2017/0163217 | A1 * | 6/2017 | Bonebright ............. | H03F 3/245 |
| 2018/0123622 | A1 * | 5/2018 | Tan ........................ | H04W 52/52 |

OTHER PUBLICATIONS

International Search Report and Written Opinion of the International Searching Authority from PCT/US2021/038146, dated Jul. 13, 2021, 1-7 pages.

* cited by examiner

*Primary Examiner* — Ankur Jain
(74) *Attorney, Agent, or Firm* — Straub & Straub; Michael P. Straub; Stephen T. Straub

(57) ABSTRACT

Controllable radio frequency power amplifiers (RFPAs), e.g., in a Hybrid-MIMO array, which are being driven at lower power levels, are operated at conditions such that their inherent EVM and ACLR are intentionally further increased. This increase of inherent EVM and ACLR is done in a precise manner, and the increased inherent EVM and ACLR are cancelled or reduced by the EVM and ACLR of the input Array DPD signal. The net result is improved EVM and ACLR performance over a broader range of angles. Exemplary methods and apparatus for increasing distortion include individual or combinations of: i) changing the DC bias a RFPA based on average operating power level; ii) changing supply voltage, e.g. Vcc, of a RFPA based on average operating power level, iii) adding a controllable non-linear element, such as a diode or varactor, at the input of the RFPA, based on the average operating power.

18 Claims, 9 Drawing Sheets

510 — CONTROL THE FIRST POWER AMPLIFIER TO INTENTIONALLY INTRODUCE LESS SIGNAL DISTORTION INTO THE PRE-DISTORTED SIGNAL BEING AMPLIFIED BY THE FIRST POWER AMPLIFIER THAN IS INTENTIONALLY INTRODUCED BY THE SECOND POWER AMPLIFIER OR TO CONTROL THE FIRST POWER AMPLIFIER TO AMPLIFY THE PRE-DISTORTED SIGNAL WITHOUT THE INTENTIONAL INTRODUCTION OF SIGNAL DISTORTION INTO THE PRE-DISTORTED SIGNAL BEING AMPLIFIED

512 → 516 — CONTROL THE SECOND POWER AMPLIFIER TO INTENTIONALLY INTRODUCE SIGNAL DISTORTION INTO THE PRE-DISTORTED SIGNAL BEING AMPLIFIED BY THE SECOND POWER AMPLIFIER

518 — CONTROL ONE OR MORE OF: i) A BIAS VOLTAGE SUPPLIED TO A BIAS VOLTAGE INPUT OF A SECOND POWER AMPLIFIER, ii) A SUPPLY VOLTAGE (E.G. Vcc) SUPPLIED TO THE SECOND POWER AMPLIFIER AND iii) A NON-LINEAR CONTROL CIRCUIT COUPLED TO A SIGNAL INPUT OF THE SECOND POWER AMPLIFIER TO WHICH THE PRE-DISTORTED SIGNAL IS SUPPLIED 520 — CONTROL A BIAS VOLTAGE, E.G., A DC BIAS VOLTAGE, SUPPLIED TO A BIAS VOLTAGE INPUT OF THE SECOND POWER AMPLIFIER 519 — CHANGE THE DC BIAS VOLTAGE AS A FUNCTION OF THE AVERAGE OPERATING POWER LEVEL OF THE SECOND POWER AMPLIFIER 521 — CONTROL AN OPERATING VOLTAGE (E.G. Vcc) SUPPLIED TO THE SECOND POWER AMPLIFIER 522 — CONTROL A VOLTAGE SETTING OF A NON-LINEAR CONTROL CIRCUIT COUPLED TO A SIGNAL INPUT, OF THE SECOND POWER AMPLIFIER, TO WHICH THE PRE-DISTORTED SIGNAL IS SUPPLIED 532 — CHANGING AT LEAST ONE OF ONE OR MORE POWER AMPLIFIER CONTROL PARAMETERS USED TO THE CONTROL THE SECOND POWER AMPLIFIER IN RESPONSE TO A CHANGE IN AVERAGE INPUT POWER TO THE SECOND POWER AMPLIFIER 508 (A)

514 — CONTROL THE THIRD POWER AMPLIFIER TO INTENTIONALLY INTRODUCE SIGNAL DISTORTION INTO THE PRE-DISTORTED SIGNAL BEING AMPLIFIED BY THE THIRD POWER AMPLIFIER

524 — CONTROL ONE OR MORE OF: i) A BIAS VOLTAGE SUPPLIED TO A BIAS VOLTAGE INPUT OF A THIRD POWER AMPLIFIER, ii) A SUPPLY VOLTAGE (E.G. Vcc) SUPPLIED TO THE THIRD POWER AMPLIFIER AND iii) A NON-LINEAR CONTROL CIRCUIT COUPLED TO A SIGNAL INPUT OF THE THIRD POWER AMPLIFIER TO WHICH THE PRE-DISTORTED SIGNAL IS SUPPLIED 526 — CONTROL A BIAS VOLTAGE, E.G., A DC BIAS VOLTAGE, SUPPLIED TO A BIAS VOLTAGE INPUT OF THE THIRD POWER AMPLIFIER 527 — CHANGE THE DC BIAS VOLTAGE AS A FUNCTION OF THE AVERAGE OPERATING POWER LEVEL OF THE THIRD POWER AMPLIFIER 528 — CONTROL AN OPERATING VOLTAGE (E.G. Vcc) SUPPLIED TO THE THIRD POWER AMPLIFIER 530 — CONTROL A VOLTAGE SETTING OF A NON-LINEAR CONTROL CIRCUIT COUPLED TO A SIGNAL INPUT, OF THE THIRD POWER AMPLIFIER, TO WHICH THE PRE-DISTORTED SIGNAL IS SUPPLIED 534 — CHANGING AT LEAST ONE OF ONE OR MORE POWER AMPLIFIER CONTROL PARAMETERS USED TO THE CONTROL THE THIRD POWER AMPLIFIER IN RESPONSE TO A CHANGE IN AVERAGE INPUT POWER TO THE THIRD POWER AMPLIFIER

METHODS AND APPARATUS FOR USING SIGNAL PRE-DISTORTION WITH INDIVIDUAL POWER AMPLIFIER (PA) CONTROL

RELATED APPLICATIONS

The present application claims the benefit of the filing date of U.S. Provisional Patent Application Ser. No. 63/042,533 which was filed on Jun. 22, 2020 and which is hereby expressly incorporated by reference in its entirety.

FIELD

The present application relates to methods and apparatus for using power amplifiers as part of a signal transmission apparatus and more particularly to methods and apparatus for using a combination of digital pre-distortion in combination with individual power amplifier control in a system including multiple antenna elements and power amplifiers.

BACKGROUND

Radio Frequency (RF) power amplifiers amplify the signals that allow wireless devices to communicate with each other. Fidelity in amplification is an important system metric and is measured by parameter such as Error Vector Magnitude (EVM) and Adjacent Channel Leakage Ration (ACLR). In single antenna systems, EVM and ACLR do not change with the angle at which the wireless device is observed. Modern wireless communications, such as Multiple Input Multiple Output (MIMO) wireless communications systems, use multiple antennas which allow the radiated power to be directed toward one direction. In general, in such systems EVM and ACLR change with the angle at which the wireless device is observed.

Digital Pre-Distortion (DPD) techniques have long been employed to increase the efficiency and EVM of RF power amplifiers. Typically one DPD apparatus linearizes one RF power amplifier. In Hybrid-MIMO systems, multiple RF power amplifiers are driven by gain and phase modified versions of a common transmit signal. Different amounts of distortion are produced by each power amplifier. Ideally to reduce distortion of the system one would employ multiple DPD feedback loops, one for each PA. For reasons of economy, it is desired to take advantage of this common signal source, and linearize all of the RF amplifiers driven by this common signal with one DPD apparatus. A Sum-DPD takes the sum of each of the outputs from the multiple PAs and applies DPD to that signal. This lower cost approach reduces the distortion at "0" degree viewing angle; however, distortion at other angles will often increase. Thus this approach comes at a cost of reduced signal quality in some directions that are part of the desired direction, and also in directions away from the main beam, and result in ACLR and EVM specifications being compromised.

Techniques such as Array DPD have been explored to optimize the signal quality in the direction of the main beam. In a Hybrid-MIMO system using Array-DPD, the outputs of the various PAs are weighted with gain and phase and then combined. This approach allows distortion to be reduced at an arbitrary angle; however, distortion at angles other than the optimization angle will often increase.

The DPD signal from an Array DPD, typically optimizes the EVM and ACLR at an angle of observation (resulting in low EVM and ACLR at the angle of observation). This leads to the RFPAs being driven at higher power levels having their EVM and ACLR being almost cancelled, while the RFPAs being driven at lower power levels having their EVM and ACLR being worsened, such that there is a net improvement at the desired angle. However, at angles away from the desired angle, the EVM and ACLR from the RFPAs being driven at lower power levels do not cancel out and may dominate.

In view of the above discussion there is a need for new methods and apparatus for reducing EVM and/or ACLR in communications devices including multiple power amplifiers which utilize of common digital pre-distorter.

SUMMARY

Various exemplary methods and embodiments, implemented in accordance with one or more features of the present invention, are directed to new methods and apparatus which improve EVM and ACLR over observation angles of interest as compared to current approaches.

An exemplary embodiment, in accordance with the present invention, is designed to increase the distortion in the radio frequency power amplifiers (RFPAs) in a Hybrid-MIMO array which are being driven at lower power levels.

In accordance with various exemplary embodiments, controllable RFPAs, which are being driven at lower power levels, are operated at conditions such that their inherent EVM and ACLR are intentionally further increased. In accordance, with a feature of various exemplary embodiments, this increase of inherent EVM and ACLR is done in a precise manner, and the increased inherent EVM and ACLR are cancelled or reduced by the EVM and ACLR of the input Array DPD signal. The net result is improved EVM and ACLR performance over a broader range of angles.

To achieve a measured and precise increase in the EVM and ACLR of the RFPAs being driven at lower power, various alternative exemplary methods and apparatus can be, and sometimes are employed. Exemplary methods and apparatus include, but are not limited to, individual or combinations of: i) changing the DC bias a RFPA based on average operating power level; ii) changing supply voltage, e.g. Vcc, of a RFPA based on average operating power level, iii) adding a controllable non-linear element, such as a diode or varactor, at the input of the RFPA, based on the average operating power.

An exemplary communications method, in accordance with various embodiments, comprises: applying signal pre-distortion to a signal to be transmitted to distort the signal prior to transmission, the distorted signal being a pre-distorted signal; supplying the pre-distorted signal to power amplifiers in a transmission array, the power amplifiers in the transmission array including a first power amplifier corresponding to a first transmitter element and a second power amplifier corresponding to a second transmitter element, the first power amplifier being driven at a first power level, said second power amplifier being driven at a second power level lower than said first power level; and controlling the second power amplifier to intentionally introduce signal distortion into the pre-distorted signal being amplified by the second power amplifier.

BRIEF DESCRIPTION OF THE FIGURES

FIG. 5B is a second part of a flowchart of an exemplary method of operating a communications device, e.g., a communications device including an array of transmitters, in accordance with an exemplary embodiment.

FIG. 5 comprises the combination of FIG. 5A and FIG. 5B.

DETAILED DESCRIPTION

In some embodiments, every RF PA has controllable inputs other than its RF input, e.g., one or more power supply inputs, one or more bias level settings, etc. In addition, in some embodiments, non-linear elements, can be, and sometimes are, added to the input of the PA to create additional input points that provide the ability to change the distortion generated by the PA. This is different from DPD changing the distortion of the PA, as DPD works on the actual input waveform, and thus has the ability to work at high speed. High speed increased circuit cost, power consumption and size.

Controlling the operating parameters of the RF PA is relatively cheap in terms of circuit cost, power consumption and size, as the parameters do not change quickly over time. Rather these parameters, in some embodiments, are only controlled to change when the average input power of the RF PA is changed, e.g., above a predetermined limit, and/or when the input waveform is itself changed substantially.

Exemplary k parameters represent inputs of the RF PA which are controlled such that "individual PA control" is achieved. The k parameters are, e.g., inputs or controls such as supply voltages, bias voltages, controls for insertion of non-linear elements, etc.

In various exemplary embodiments, the distortion of each PA can be, and sometimes is, controllable increased or modified.

Figure 1:
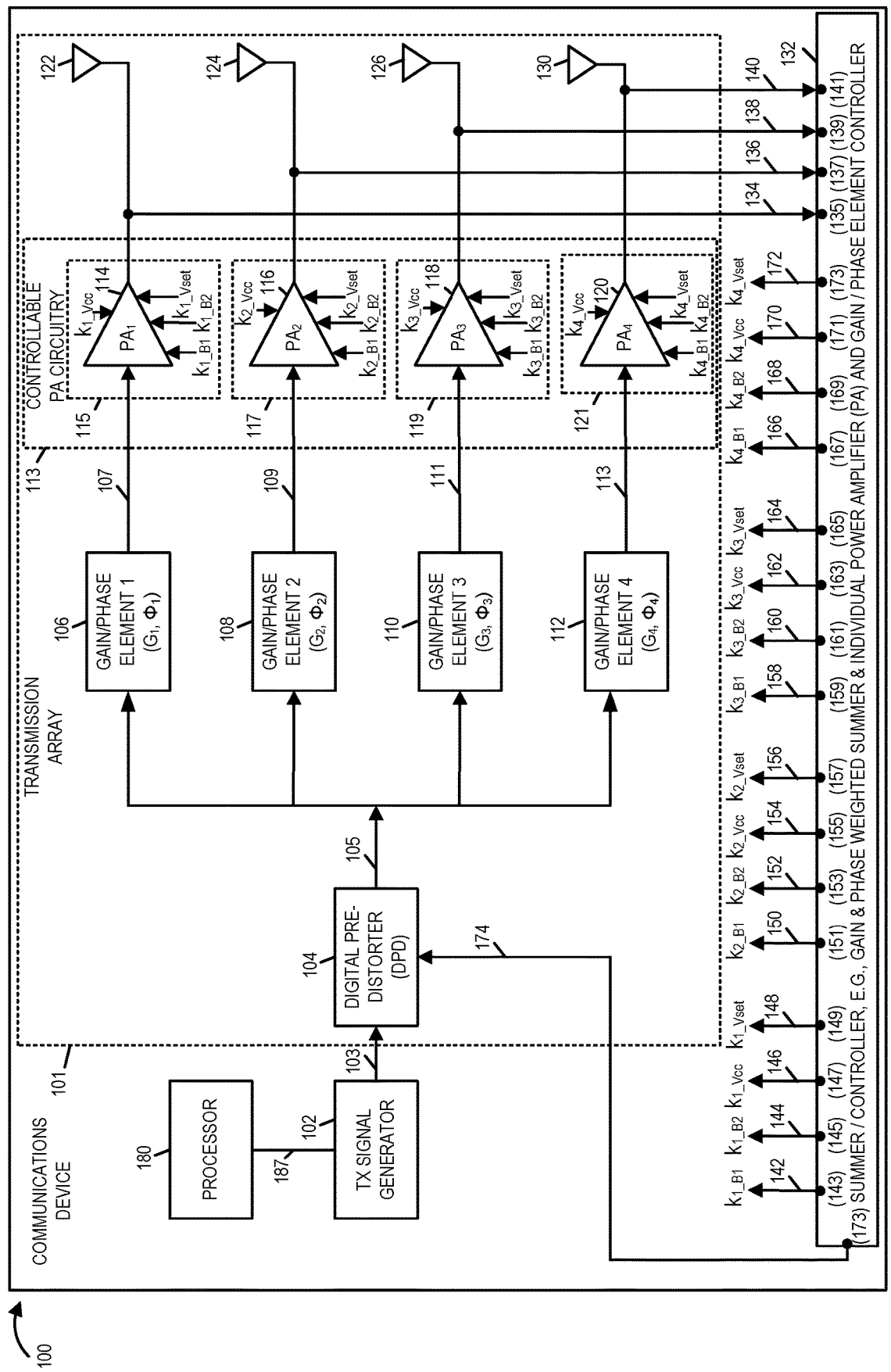
FIG. 1 is a drawing of an exemplary communications device including a transmission array including a plurality of transmission (TX) chains, each TX chain including a controllable power amplifier (PA) into which intentional distortion may be, and sometimes is, introduced, a single digital pre-distorter (DPD) used by the TX array, and a controller, in accordance with an exemplary embodiment.

FIG. 1 is a drawing of an exemplary communications device 100 including a transmission array 101, a transmission (TX) signal generator 102, and a controller 132, e.g., a gain & phase weighted sums and individual power amplifier (PA) controller.

The transmission array 101 includes a single digital pre-distorter (DPD) 105 coupled to a plurality of transmit chains. In this example 4 transmit chains are shown; however in various embodiments, there are N transmit chains, e.g., where N is a large number, e.g. N=64. The first transmit chain includes controllable gain/phase element 1 106, controllable power amplifier circuitry 1 115 including power amplifier 1 (PA1) 114, and transmit antenna or transmit antenna element 122. The second transmit chain includes controllable gain/phase element 2 108, controllable power amplifier circuitry 2 117 including power amplifier 2 (PA2) 116, and transmit antenna or transmit antenna element 124. The third transmit chain includes controllable gain/phase element 2 110, controllable power amplifier circuitry 3 119 including power amplifier 3 (PA3) 118, and transmit antenna or transmit antenna element 126. The fourth transmit chain includes controllable gain/phase element 3 110, controllable power amplifier circuitry 3 119 including power amplifier 3 (PA2) 120, and transmit antenna or transmit antenna element 130.

Controller 132 generates and sends control signals to each of the gain/phase elements (106, 108, 110, 112) to set the gain/phase values ((G1, Φ1), (G2, Φ2), (G3, Φ3), (G4, Φ4), respectively, for a particular beam direction.

Controller 132 may, and sometimes does, determine values for, generates and sends one or more or all of: control signals (bias control signal k1_B1 142, bias control signal k1_B2 144, Vcc control signal k1_VCC 146, non-linear circuit voltage control signal k1_VSET 148), via output pins (143, 145, 146, 148), respectively, to control the PA 1 circuitry 115 to intentionally introduce signal distortion into the received signal 107 being amplified.

Controller 132 may, and sometimes does, determine values for, generates and sends one or more or all of: control signals (bias control signal k2_B1 150, bias control signal k2_B2 152, Vcc control signal k2_VCC 154, non-linear circuit voltage control signal k2_VSET 156), via output pins (151, 153, 155, 157), respectively, to control the PA 2 circuitry 117 to intentionally introduce signal distortion into the received signal 109 being amplified.

Controller 132 may, and sometimes does, determine values for, generates and sends one or more or all of: control signals (bias control signal k3_B1 158, bias control signal k3_B2 160, Vcc control signal k3_VCC 162, non-linear circuit voltage control signal k3_VSET 164), via output pins (159, 161, 163, 165), respectively, to control the PA 3 circuitry 119 to intentionally introduce signal distortion into the received signal 111 being amplified.

Controller 132 may, and sometimes does, determine values for, generates and sends one or more or all of: control signals (bias control signal k4_B1 166, bias control signal k4_B2 168, Vcc control signal k4_VCC 170, non-linear circuit voltage control signal k4_VSET 172), via output pins (167, 169, 171, 173), respectively, to control the PA 4 circuitry 121 to intentionally introduce signal distortion into the received signal 113 being amplified.

Controller 132 receives PA (PA1 114, PA2 116, PA3 118, PA4 120) output signals (134, 136, 138, 140) via controller input pins (135, 137, 139, 141) and generates a pre-distortion control signal 174, which is output from controller 132 via output pin 173 and sent to DPD 174 to control the DPD 174 to introduce pre-distortion into the signal 103 received from TX signal generator 102. The DPD 104 which receives input signal 103 and pre-distortion control signal 174, generates and output pre-distorted signal 105, which is fed as input into each of the TX chains.

Gain/phase element 1 106, which receives pre-distorted signal 105, introduce the desired gain/phase (G1, Φ1) for the selected beam angle, producing output signal 107, which is fed as input to the PA 1 circuitry 115. PA 1 circuitry 115 amplifies the received input signal 107 and may, and sometimes does, introduce intentional signal distortion, under the control of controller 132, producing output signal 134, which is sent to antenna 122 and is also used as input to controller 132.

Gain/phase element 2 108, which receives pre-distorted signal 105, introduces the desired gain/phase (G2, Φ2) for the selected beam angle, producing output signal 109, which is fed as input to the PA 2 circuitry 117. PA 2 circuitry 117 amplifies the received input signal 109 and may, and sometimes does, introduce intentional signal distortion, under the control of controller 132, producing output signal 136, which is sent to antenna 124 and is also used as input to controller 132.

Gain/phase element 3 110, which receives pre-distorted signal 105, introduces the desired gain/phase (G3, Φ3) for the selected beam angle, producing output signal 111, which is fed as input to the PA 3 circuitry 119. PA 3 circuitry 119 amplifies the received input signal 111 and may, and sometimes does, introduce intentional signal distortion, under the control of controller 132, producing output signal 138, which is sent to antenna 126 and is also used as input to controller 132.

Gain/phase element 4 112, which receives pre-distorted signal 105, introduces the desired gain/phase (G4, Φ4) for the selected beam angle, producing output signal 113, which is fed as input to the PA 4 circuitry 121. PA 4 circuitry 121 amplifies the received input signal 113 and may, and sometimes does, introduce intentional signal distortion, under the control of controller 132, producing output signal 140, which is sent to antenna 130 and is also used as input to controller 132.

The signals shown in FIG. 1 go over corresponding lines, e.g., links. For example signal 103 goes over communications link 192 (shown in FIG. 6).

Figure 2:
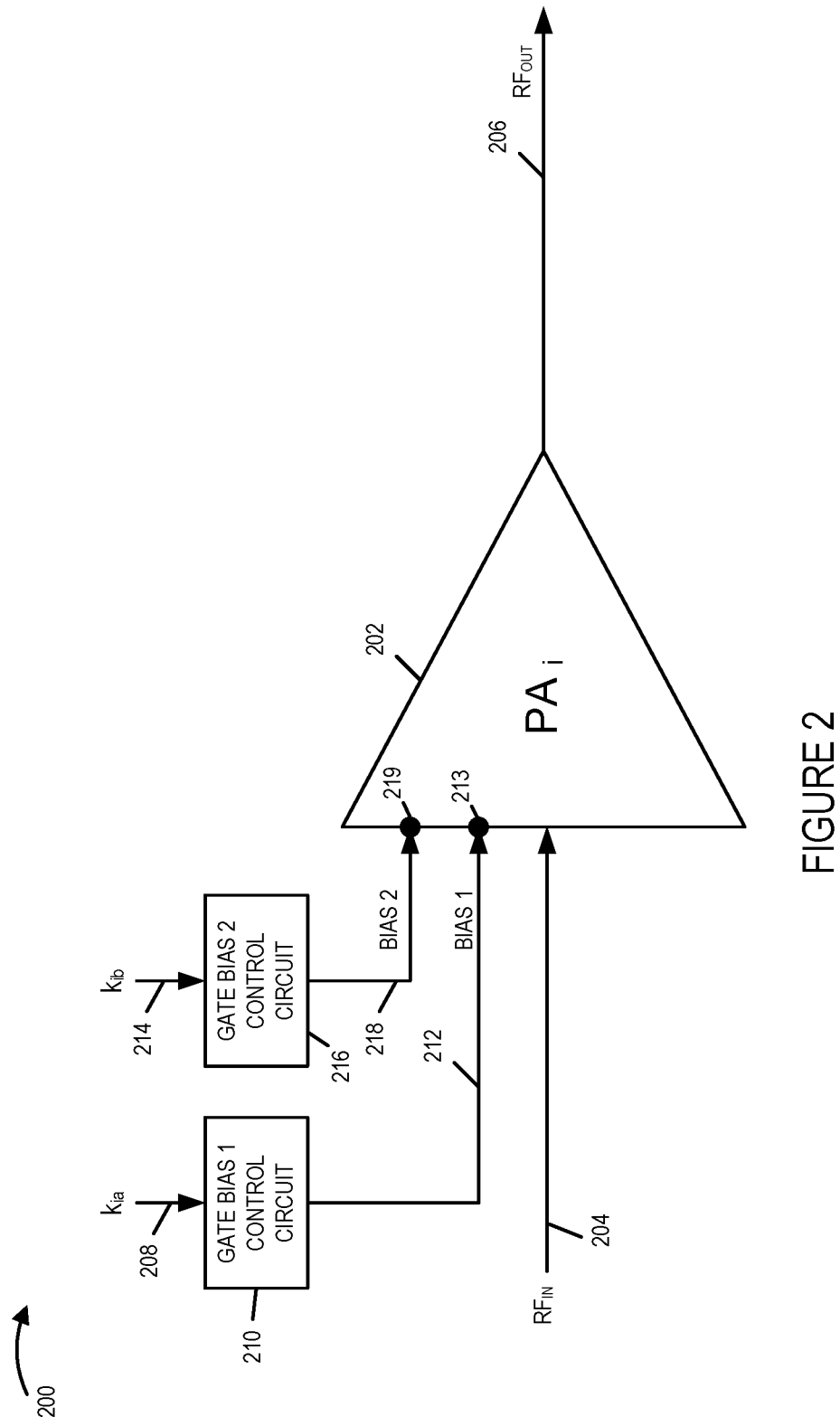
FIG. 2 is a drawing exemplary controllable power amplifier circuitry in which distortion is introduced via controlling one or more bias voltages to be set, e.g. changed from optimal control values for no or minimal distortion.

FIG. 2 is a drawing an exemplary controllable power amplifier circuitry 200 in which distortion is introduced via controlling one or more bias voltages to be set, e.g. changed from optimal control values for no or minimal distortion. Exemplary controllable power amplifier circuit 200 is, e.g., any of the controllable PA circuits (115, 117, 119, 121) of transmission array 101 of communications device 100 of FIG. 1.

Exemplary controllable power amplifier circuit 200 includes power amplifier i (PAi) 202 a gate bias 1 control circuit 210, and a gate bias 2 control circuit 216 coupled together as shown. Gate bias 1 control circuit 210 receives input control signal kia 208, e.g., from controller 132, and generates bias 1 212 which is input via input pin 213 of power amplifier 202. Input control signal kia 208 is, e.g., one of control signal k1_B1 142, k2_B1 150, k3_B1 158, k4_B1 166. Gate bias 2 control circuit 216 receives input control signal kib 214, e.g., from controller 132, and generates bias 2 218 which is input via input pin 219 of power amplifier 202. Input control signal kib 214 is, e.g., one of control signal k1_B2 144, k2_B2 152, k3_B2 160, k4_B2 168.

PAi 202 receives input RF signal (RFIN) 204, amplifies the received signal, generating output RF signal (RFOUT) 206, e.g. an output signal which may, and sometimes does, include controlled intentional distortion.

Figure 3:
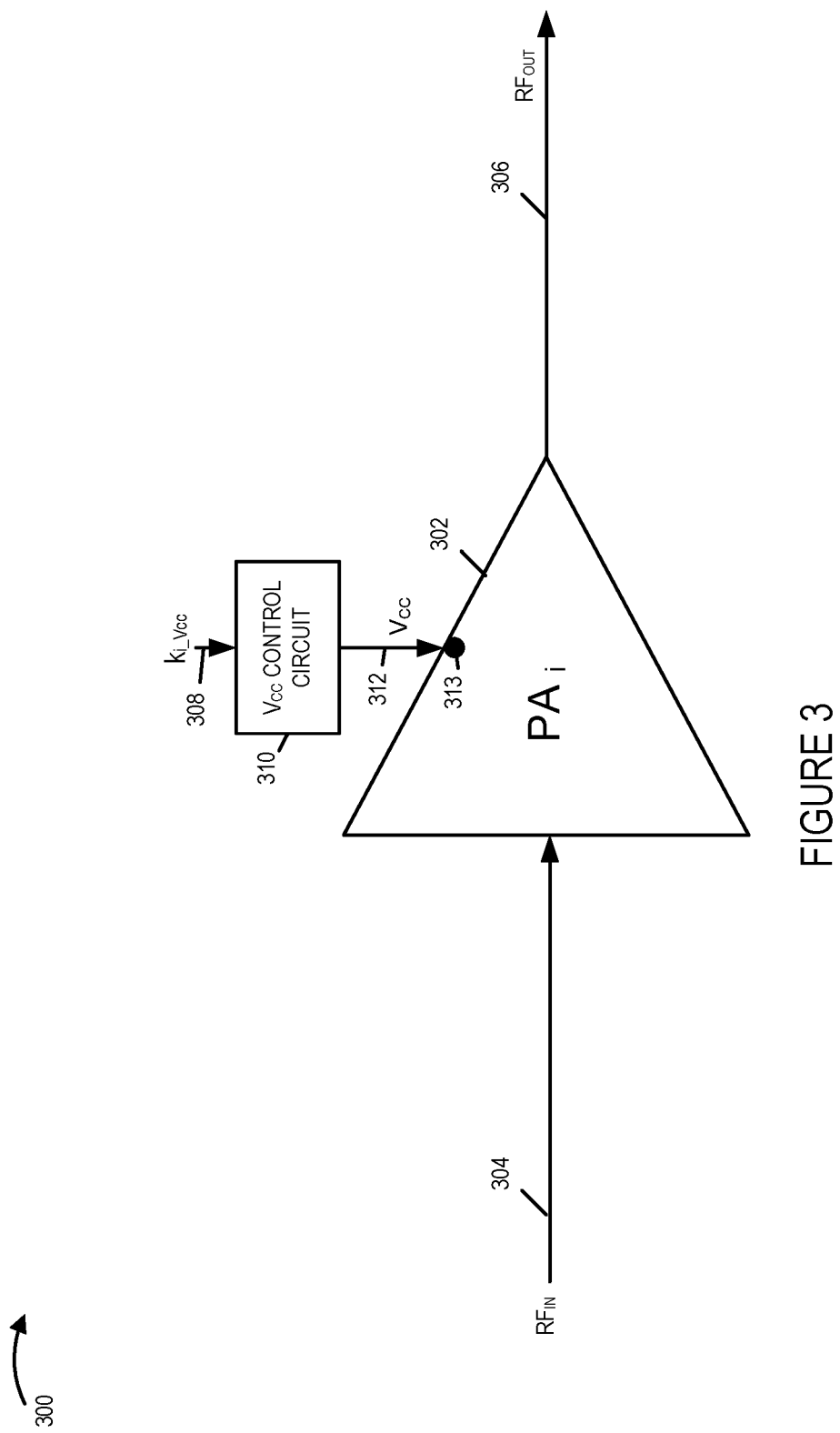
FIG. 3 is a drawing exemplary controllable power amplifier circuitry in which distortion is introduced via controlling a supply, e.g. changing the supply voltage from the nominal value to introduce distortion.

FIG. 3 is a drawing an exemplary controllable power amplifier circuitry 300 in which distortion is introduced via controlling a supply, e.g. changing the supply voltage from the nominal value to introduce distortion. Exemplary controllable power amplifier circuit 300 is, e.g., any of the controllable PA circuits (115, 117, 119, 121) of transmission array 101 of communications device 100 of FIG. 1.

Exemplary controllable power amplifier circuit 200 includes power amplifier i (PAi) 302 a Vcc control circuit 310 coupled together as shown. Vcc control circuit 310 receives input control signal kiVCC 308, e.g., from controller 132, and generates VCC input voltage 312 which is input via input pin 313 of power amplifier 302. Input control signal kiVCC 408 is, e.g., one of control signal k1_VCC 146, k2_VCC 154, k3_VCC 162, k4_VCC 170.

PAi 302 receives input RF signal (RFIN) 304, amplifies the received signal, generating output RF signal (RFOUT) 306, e.g. an output signal which may, and sometimes does, include controlled intentional distortion.

Figure 4:
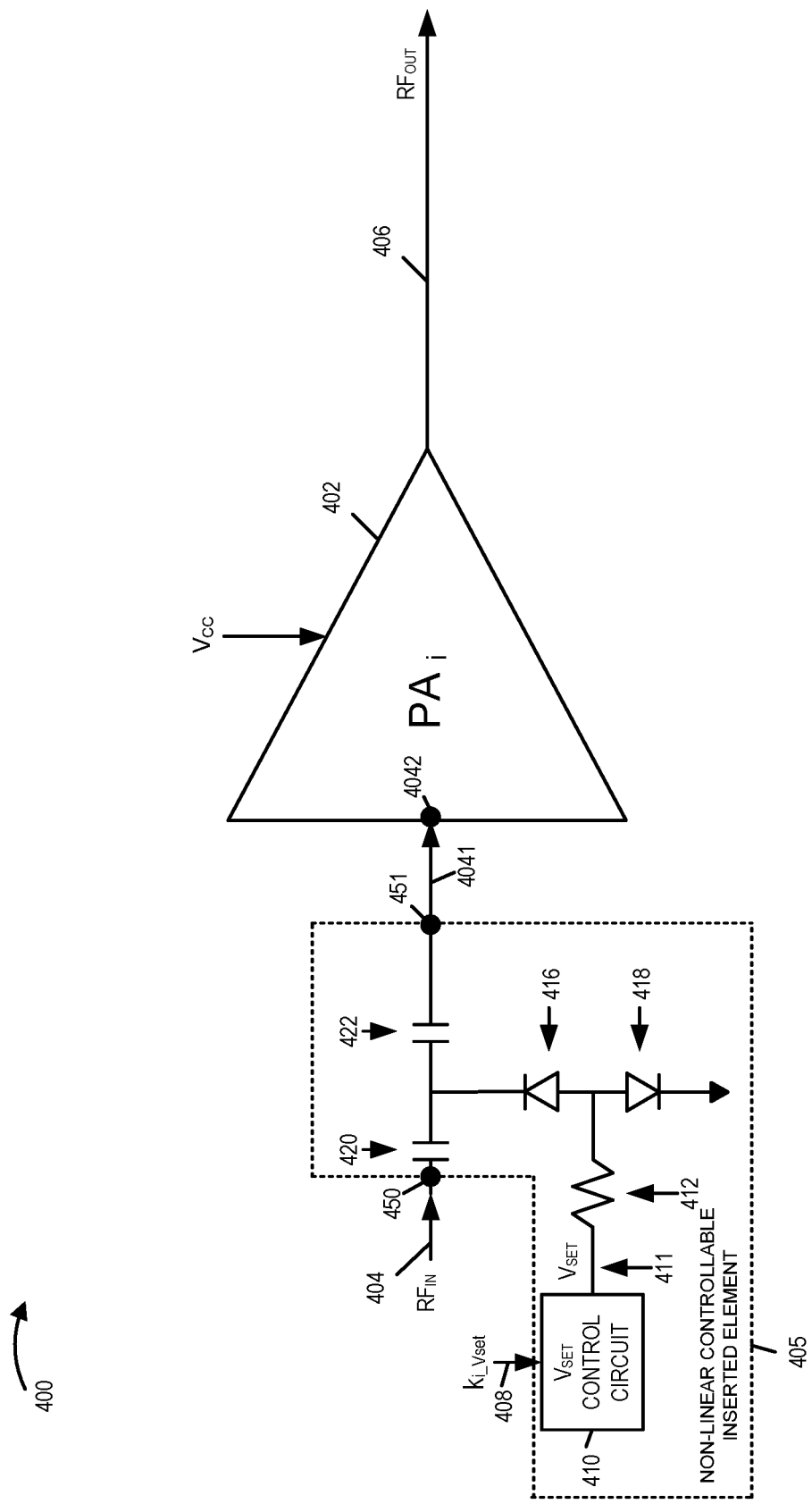
FIG. 4 is a drawing exemplary controllable power amplifier circuitry in which distortion is introduced via introducing and controlling a non-linear circuit into the input path.

FIG. 4 is a drawing an exemplary controllable power amplifier circuitry 400 in which distortion is introduced via introducing and controlling a non-linear circuit into the input path. Exemplary controllable power amplifier circuit 400 is, e.g., any of the controllable PA circuits (115, 117, 119, 121) of transmission array 101 of communications device 100 of FIG. 1.

Exemplary controllable power amplifier circuit 400 includes non-linear controllable inserted element 405 coupled to the input 4042 of power amplifier i (PAi) 402. Exemplary non-linear controllable inserted element 405 includes a Vset control circuit 410, resistor 412, diodes 416, 418, and capacitors 420, 422 coupled together as shown. Input control signal kiVSET 408 is received as input to Vset control circuit 410, which set the value of VSET 411, to introduce controlled non-linearity. Input control signal kiVSET 408 is, e.g., one of control signal k1_VSET 148, k2_VSET 156, k3_VCC 164, k4_VSET 172.

Input terminal 450 of non-linear controllable inserted element 405 receives input RF signal (RFIN) 404. Non-linear controllable element 405 outputs signal 4041 via terminal 451, and feeds signal 4041 to the input 4042 of PAi 4042, which amplifies the received signal, generating output RF signal (RFOUT) 306, e.g. an output signal which may, and sometimes does, include controlled intentional distortion with respect to RFIN signal 404.

FIG. 2 illustrates introduced controlled distortion in a power amplifier circuit via controlling power amplifier bias, e.g. DC bias, value(s). FIG. 3 illustrates introduced controlled distortion in a power amplifier circuit via controlling an input voltage supply. FIG. 3 illustrates introduced controlled distortion in a power amplifier circuit via including and controlling a non-linear element in the input path to the power amplifier. It should be appreciated that combinations of these three alternative approaches may be, and sometimes are, used in various embodiments.

Figure 5A:
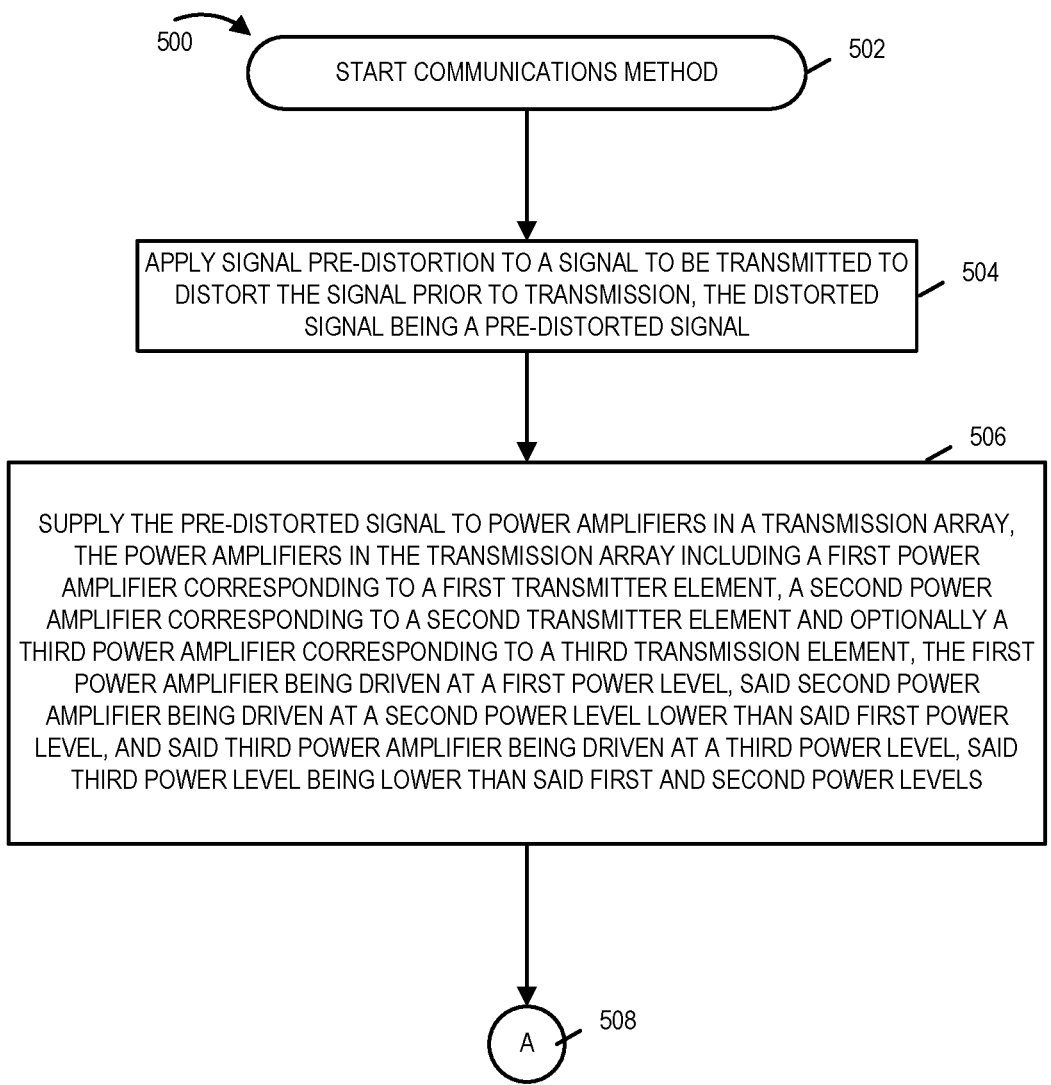
FIG. 5A is a first part of a flowchart of an exemplary method of operating a communications device, e.g., a communications device including an array of transmitters, in accordance with an exemplary embodiment.

FIG. 5, comprising the combination of FIG. 5A and FIG. 5B, is a flowchart 500 of an exemplary method of operating a communications device, e.g., a communications device including an array of transmitters, in accordance with an exemplary embodiment. Operation starts in step 502 in which the communications device is powered on and initialized. Operation proceeds from start step 502 to step 504.

In step 504, a pre-distortion signal is applied to a signal to be transmitted to distort the signal prior to transmission, the distorted signal being a pre-distorted signal. In various embodiments, said signal pre-distortion at least partially compensates for signal distortion unintentionally introduced by one or more to the power amplifiers in the transmission array. Operation proceeds from step 504 to step 506.

In step 506 the pre-distorted signal is supplied to power amplifiers in a transmission array, the power amplifiers in the transmission array including a first power amplifier corresponding to a first transmitter element, a second power amplifier corresponding to a second transmitter element, and optionally, a third power amplifier corresponding to a third transmission element, said second power amplifier being driven at a first power level, said second power amplifier being driven at second power level lower than said first power level, and said third power amplifier, when included, being driven at a third power level, said third power level being lower than said first and said second power levels. Operation proceeds from step 506, via connecting node A 508 to step 510, 512 and 514.

In step 510 the first power amplifier is controlled to intentionally introduce less signal distortion into the pre-distorted signal being amplified by the first power amplifier than is intentionally introduced by the second power amplifier or to control the first power amplifier to amplify the pre-distorted signal without intentional introduction of distortion into the pre-distorted signal being amplified.

In step 512, the second power amplifier is controlled to intentionally introduce signal distortion into the pre-distorted signal being amplified by the second power amplifier. Step 512 includes step 516. In step 516, the controller controls one or more or all of: i) a bias voltage supplied to a bias voltage input of a second power amplifier, ii) a supply voltage (e.g., Vcc) supplied to the second power amplifier, and iii) a non-linear control circuit coupled to a signal input of the second power amplifier to which the pre-distorted signal is supplied. Step 516 includes one or more or all of steps 518, step 520 and step 522. In step 518 the controller controls a bias voltage, e.g., a DC bias voltage, supplied to a bias voltage input of the second power amplifier. Step 518 may, and sometimes does includes step 519 in which the controller changes the DC bias voltage as a function of the average operating power level of the second power amplifier. In step 520 the controller controls an operating voltage (e.g., Vcc) supplied to the second power amplifier. In step 522 the controller controls a voltage setting of a non-linear control circuit coupled to a signal input of the second power amplifier to which the pre-distortion is supplied.

In some embodiments, the second power amplifier is driven at a power level that results in a higher error vector magnitude (EVM) and/or higher adjacent channel leakage ratio (ACLR) than would be introduced if the second power amplifier operated at a higher power level; and the pre-distorter introduces signal distortion which cancels out at least some of the signal distortion introduced by operating the second power amplifier at said power level.

In step 514, the third power amplifier is controlled to intentionally introduce signal distortion into the pre-distorted signal being amplified by the third power amplifier. Step 514 includes step 524. In step 524, the controller controls one or more or all of: i) a bias voltage supplied to a bias voltage input of the third power amplifier, ii) a supply voltage (e.g., Vcc) supplied to the third power amplifier, and iii) a non-linear control circuit coupled to a signal input of the third power amplifier to which the pre-distorted signal is supplied. Step 524 includes one or more or all of steps 526, step 528 and step 530. In step 526 the controller controls a bias voltage, e.g., a DC bias voltage, supplied to a bias voltage input of the third power amplifier. Step 526 may, and sometimes does includes step 527 in which the controller changes the DC bias voltage as a function of the average operating power level of the third power amplifier. In step 528 the controller controls an operating voltage (e.g., Vcc) supplied to the third power amplifier. In step 530 the controller controls a voltage setting of a non-linear control circuit coupled to a signal input of the third power amplifier to which the pre-distortion is supplied.

In some embodiments, controlling the third power amplifier to intentionally introduce signal distortion includes: controlling the third power amplifier to intentionally introduce more signal distortion into the pre-distorted signal being amplified by the third power amplifier than is intentionally introduced by the second power amplifier or the first power amplifier.

Operation proceeds from step 512 to step 532, in which the controller changes at least one of one or more power amplifier control parameters used to control the second power amplifier in response to a change in average input power to the second power amplifier. In various embodiments, changes in the control of the second power amplifier are implemented at a slower rate than a rate at which signal pre-distortion implemented by the signal pre-distorter is changed.

Operation proceeds from step 514 to step 534, in which the controller changes at least one of one or more power amplifier control parameters used to control the third power amplifier in response to a change in average input power to the third power amplifier. In various embodiments, changes in the control of the third power amplifier are implemented at a slower rate than a rate at which signal pre-distortion implemented by the signal pre-distorter is changed.

In various embodiments, power amplifiers in said array are individually controlled and some power amplifiers are intentionally controlled to introduce distortions into the pre-distorted signal being amplified.

In some embodiments, the amount of intentional signal distortion introduced is increased the lower the power level at which the power amplifier is driven, power amplifiers driven at a lower power having more signal distortion intentionally introduced than power amplifiers driven at higher power levels.

Figure 6:
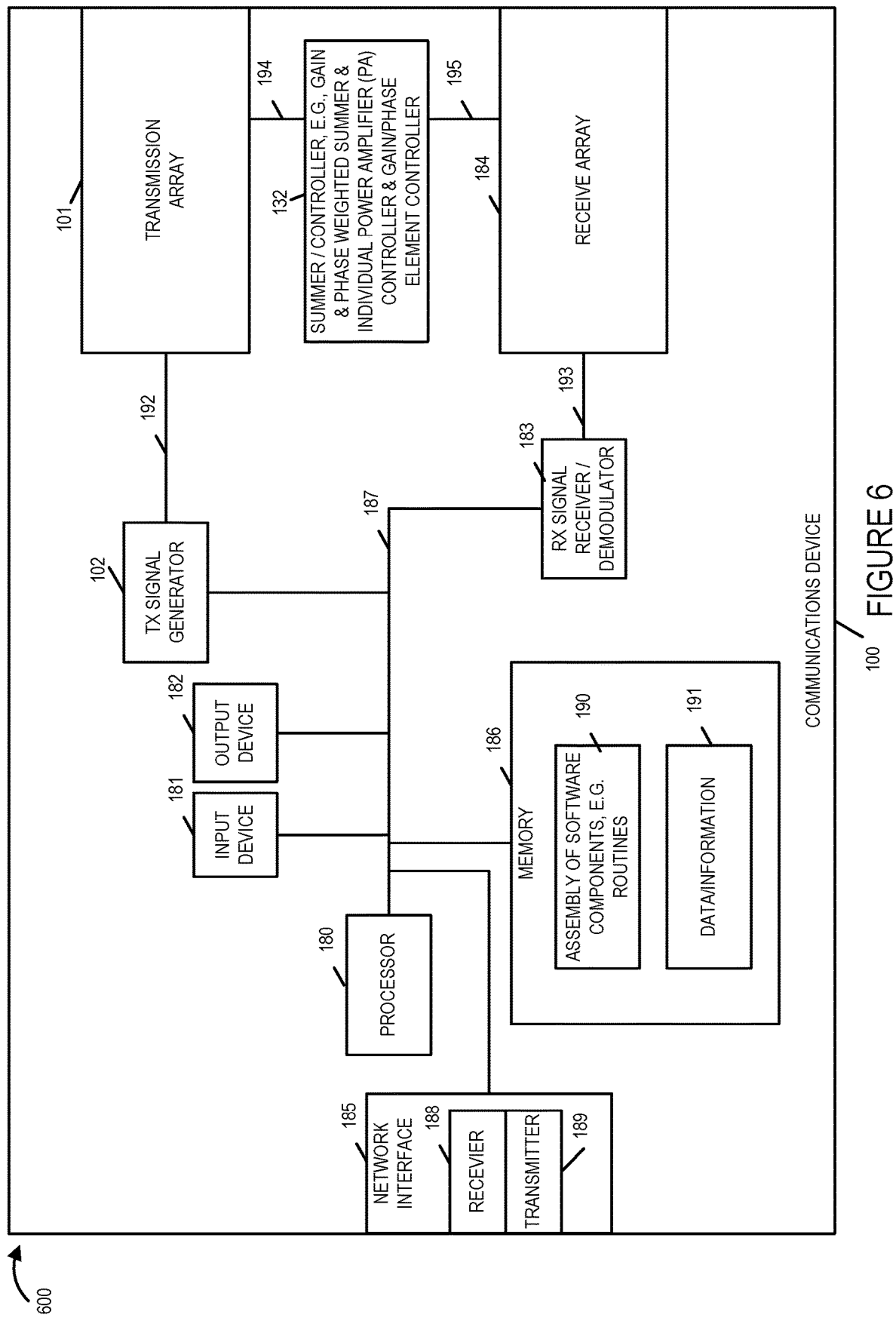
FIG. 6 is a drawing of an exemplary communications device, in accordance with an exemplary embodiment.

FIG. 6 is a drawing 600 of an exemplary communications device 100 in accordance with an exemplary embodiment, which shows additional included elements with respect to FIG. 1. Exemplary communications device 100 processor 180, input device 181, e.g., a keyboard and/or mouse, an output device 182, e.g., a display, TX signal generator 102, receive (RX) signal receiver/demodulator 183, and network interface 185 coupled together via a bus 187 over which the various elements may interchange data and information. Communications device 100 further includes a transmission array 101 coupled to TX signal generator 102 via communications link 192, and receive array 184 coupled to RX signal receiver/demodulator 183 via communications link 193. FIG. 1 illustrates further detail of transmission array 101. Receive array 184 includes, e.g., receive antenna elements, receive amplifiers, e.g., low noise RF amplifiers, and controllable gain/phase elements. Communications device 100 further includes a summer/controller 132, e.g., a gain & phase weighted summer & individual power amplifier (PA) controller and gain/phase element controller. Summer/controller 132 is coupled to transmission array 101 via bus 194. Output signals (e.g., signals 134, 136, 138, 140) from the power amplifiers (114, 116, 118, 120) of the transmission array 100 are sent via bus 194 to the summer/controller 135. A gain and phase weighted sum control signal 174 is sent as an output signal from the summer/controller 132 via bus 194 to the digital pre-distorter 104 of the transmission array 101. One or more or all of various power amp control signals (142, 144, 146, 148, 150, 152, 154, 156, 158, 160, 162, 164, 166, 168, 170, 172) are sent via bus 194 from summer/controller 132 to the controllable PA circuitry (115, 117, 119, 121) of the transmission array 101, e.g., to introduce controlled intentional distortion in one or more of the power amplifiers. In addition various control signals are sent from summer/controller 132 via bus 174 to the transmission array 101 to set controllable gain/phase elements (106, 108, 110, 112) at desired values, e.g., corresponding to a particular beam direction. Summer/controller 132 is further coupled to receive array via bus 195 via which control signal are communicated.

Network interface 185 includes a receiver 188 and a transmitter 189. Network interface 185 is, e.g. a wired or fiber optic interface for coupling the communications device to network communications devices. Memory 186 includes assembly of software components 190, e.g., routines for controlling operation of the communications device 100 and data/information 191.

In some embodiments, some components, e.g. controllable gain/phase elements (106, 108, 110, 112) and antenna elements (122, 124, 126, 130), within the transmit array 101 are also used by the receive array 184, e.g. with transmit/receive control switches being included within the communications device 100 and being controlled by controller 132. In some embodiments, the transmission array 101 and the receive array 184 are integrated together, e.g., and include an array of T/R front ends.

Figure 7:
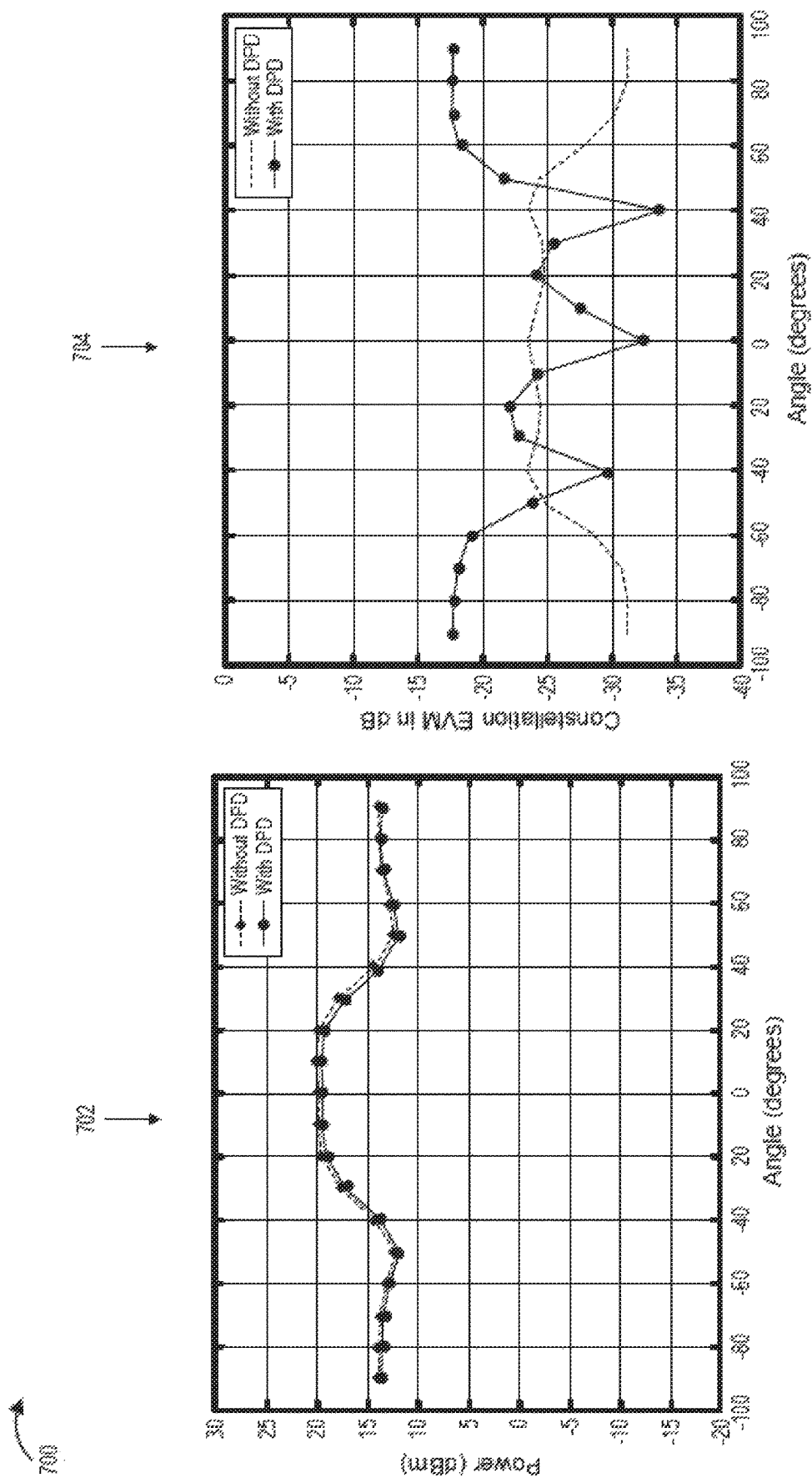
FIG. 7 is drawing illustrating an example of performance of a prior art Sum-DPD over various angles.

FIG. 7 is drawing 700 illustrating an example of performance of a prior art Sum-DPD over various angles. Left hand plot 702 shows how Hybrid-MIMO systems focus the transmitted beam to a specific range of angles. Right hand plot 704 shows how the Error Vector Magnitude (EVM) (a measure of distortion) measurement changes over the observation angle. In particular, the Sum-DPD is shown to reduce distortion at "0" degrees, but leads to increase in distortion at +/−20 degrees in this example. These two angles are part of the main beam, as shown in the left hand plot 702. Here DPD in the plot labels refers to Sum-DPD.

Figure 8:
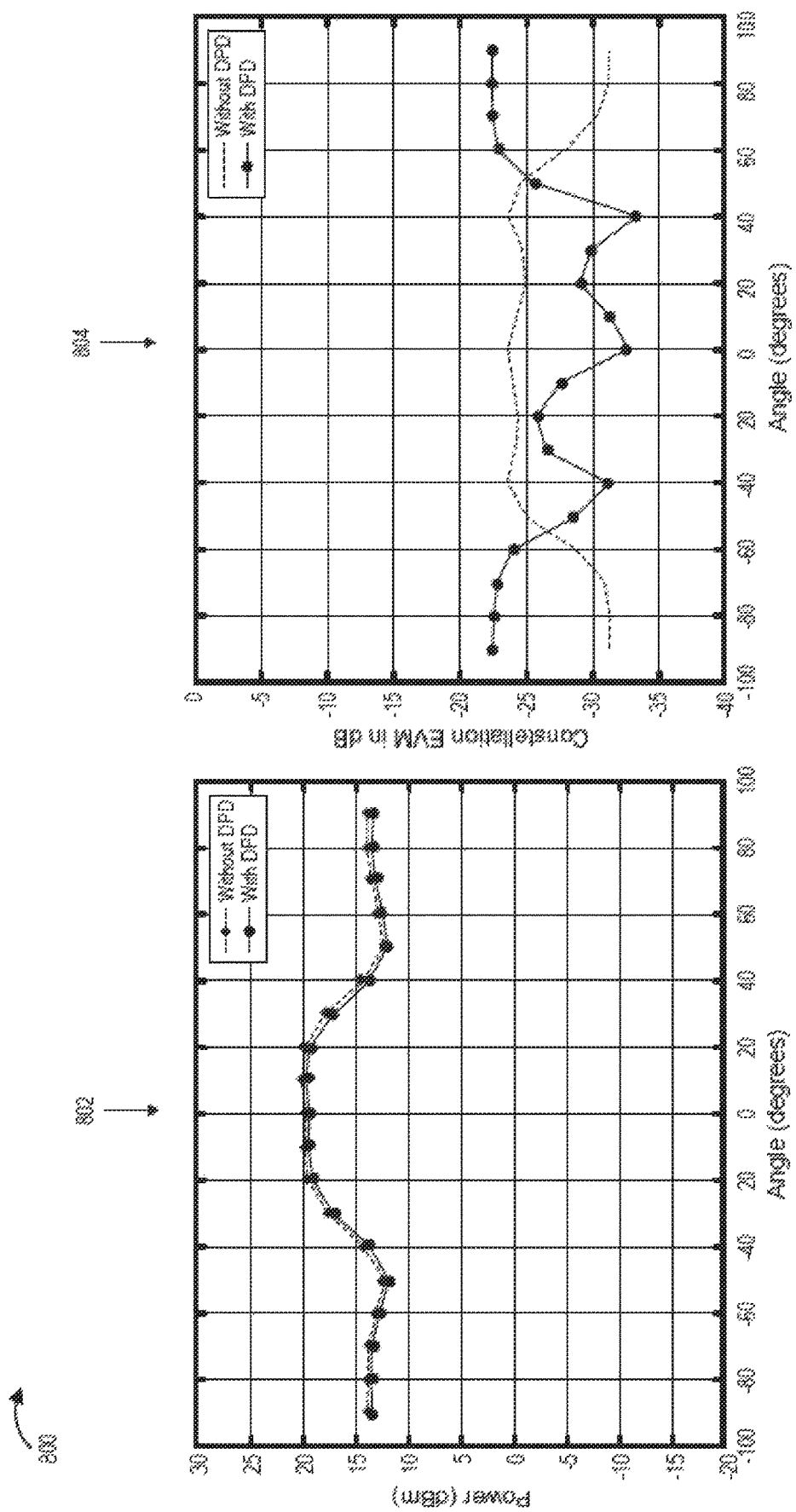
FIG. 8 is a drawing illustrating an example of performance of Sum or Array DPD with individual PA control, in accordance with an exemplary embodiment, over various angles.

FIG. 8 is a drawing illustrating an example of performance of Sum or Array DPD with individual PA control, in accordance with an exemplary embodiment, over various angles. The left hand plot 802 is the same Hybrid MIMO of FIG. 7. The right hand plot 804 shows how the EVM with Sum or Array DPD with individual PA control is improved at +/−20 degrees when compared to plot 704 of FIG. 7, in addition to continuing to improve at 0 degrees.

NUMBERED LIST OF EXEMPLARY METHOD EMBODIMENTS

Method Embodiment 1 A communications method, the method comprising: applying (504) signal pre-distortion to a signal (103) to be transmitted to distort the signal prior to transmission, the distorted signal being a pre-distorted signal (105); supplying (506) the pre-distorted signal (105) to power amplifiers (114, 116, 118, 120) in a transmission array (101) (e.g., via gain/phase elements (106, 108, 110, 112), the power amplifiers (114, 116, 118, 120) in the transmission array (101) including a first power amplifier (114) corresponding to a first transmitter element (122) and a second power amplifier (116) corresponding to a second transmitter element (124), the first power amplifier (114) being driven at a first power level, said second power amplifier (116) being driven at a second power level lower than said first power level; and controlling (512) the second power amplifier (116) to intentionally introduce signal distortion into the pre-distorted signal (105) being amplified by the second power amplifier (116).

Method Embodiment 2 The method of Method Embodiment 1, wherein controlling (512) the second power amplifier (116) to intentionally introduce signal distortion includes controlling (516) one or more of: i) a bias voltage (212 or 213) supplied to a bias voltage input (213 or 219) of the second power amplifier (116), ii) a supply voltage (e.g., Vcc) (310) supplied to the second power amplifier (116), and iii) a non-linear control circuit (405) coupled to a signal input (4042), of the second power amplifier (116), to which the pre-distorted signal (105) is supplied.

Method Embodiment 2a The method of Method Embodiment 2, wherein said step of controlling (512) the second power amplifier (116) to intentionally introduce signal distortion includes controlling (518) a bias voltage (212 or 218) supplied to a bias voltage input (213 or 219) of the second power amplifier (116).

Method Embodiment 2AC The method of Method Embodiment 2a, wherein the bias voltage (212 or 218) is a DC bias voltage of the second power amplifier (116); and wherein controlling (518) the bias voltage (212 or 216) includes changing (519) the DC bias voltage as a function of the average operating power level of the second power amplifier (116).

Method Embodiment 2B. The method of Method Embodiment 2, wherein said step of controlling (512) the second power amplifier (116) to intentionally introduce signal distortion includes controlling (520) an operating voltage (e.g., Vcc) (312) supplied to the second power amplifier (116).

Method Embodiment 2C. The method of Method Embodiment 2, wherein said step of controlling (512) the second power amplifier (116) to intentionally introduce signal distortion includes controlling (522) a voltage setting (411) of a non-linear control circuit (405) coupled to a signal input (4042), of the second power amplifier (116), to which the pre-distorted signal (105) is supplied.

Method Embodiment 3. The method of Method Embodiment 1, further comprising: controlling (510) the first power amplifier (114) to intentionally introduce less signal distortion into the pre-distorted signal (105) being amplified by the first power amplifier than is intentionally introduced by the second power amplifier (116) or to control the first power amplifier (114) to amplify the pre-distorted signal (105) without the intentional introduction of signal distortion into pre-distorted signal (105) being amplified.

Method Embodiment 3A. The method of Method Embodiment 3, wherein said transmission array (101) further includes a third power amplifier (118) corresponding to a third transmission element (126), the third power amplifier (118) being driven at a third power level, said third power level being lower than said first and second power levels; and wherein said method further comprises: controlling (514) the third power amplifier (118) to intentionally introduce signal distortion into the pre-distorted signal (105) being amplified by the third power amplifier (118).

Method Embodiment 3AA. The method of Method Embodiment 3A, wherein controlling (514) the third power amplifier (118) to intentionally introduce signal distortion includes controlling (524) one or more of: i) a bias voltage (212 or 218) supplied to a bias voltage input (213 or 219) of the third power amplifier (118), ii) a supply voltage (e.g., Vcc) (312) supplied to the third power amplifier (118), and iii) a non-linear control circuit (405) coupled to a signal input (4042) of the third power amplifier (118) to which the pre-distorted signal (105) is supplied.

Method Embodiment 3AB The method of Method Embodiment 3A, wherein controlling (514) the third power amplifier (118) to intentionally introduce signal distortion includes: controlling the third power amplifier (118) to intentionally introduce more signal distortion into the pre-distorted signal (105) being amplified by the third power amplifier than is intentionally introduced by the second power amplifier (118) or the first power amplifier (114).

Method Embodiment 4. The method of Method Embodiment 1, wherein said signal pre-distortion at least partially compensates for signal distortion unintentionally introduced by one or more to the power amplifiers in the transmission array (101).

Method Embodiment 5. The method of Method Embodiment 2, wherein control of the second power amplifier (116) is implemented based on one or more power amplifier control parameters (150, 152, 154, 156), the method further comprising: changing (532) at least one of said one or more power amplifier control parameters (150, 152, 154, 156) in response to a change in average input power to the second power amplifier (116).

Method Embodiment 6. The method of Method Embodiment 5, wherein changes in the control of the second power amplifier (116) are implemented at a slower rate than a rate at which signal pre-distortion (105) implemented by the signal pre-distorter (104) is changed.

Method Embodiment 7. The method of Method Embodiment 3a, wherein control of the third power amplifier (118) is implemented based on one or more power amplifier control parameters (158, 160, 162, 164), the method further comprising: changing (534) at least one of said one or more power amplifier control parameters (158, 160, 162, 164) used to control the third power amplifier (118) in response to a change in average input power to the third power amplifier (118).

Method Embodiment 8. The method of Method Embodiment 2, wherein power amplifiers (114, 116, 118, 120) in said array (101) are individually controlled and some power amplifiers are intentionally controlled to introduce distortions into the pre-distorted signal being amplified.

Method Embodiment 8A. The method of Method Embodiment 8, wherein the amount of intentional signal distortion introduced is increased the lower the power level at which the power amplifier is driven, power amplifiers driven at a lower power having more signal distortion intentionally introduced than power amplifiers driven at higher power levels.

Method Embodiment 9. The method of Method Embodiment 2, wherein the second power amplifier (116) is driven at a power level that results in a higher error vector magnitude (EVM) and/or higher adjacent channel leakage ratio (ACLR) than would be introduced if the second power amplifier (116) operated at a higher power level; and wherein the pre-distorter (104) introduces signal distortion which cancels out at least some of the signal distortion introduced by operating the second power amplifier (116) at said power level.

LIST OF NUMBERED DEVICE EMBODIMENTS

Device Embodiment 11. A communications device (100) comprising: a digital signal predistorter (104) controllably distorting a signal (103) to be transmitted thereby producing a pre-distorted signal (105); a plurality of antenna elements (122, 124, 126, 130); a set of power amplifiers (114, 116, 118, 120) arranged in parallel and being coupled to the digital signal predistorter (104), each of the power amplifiers in the set of power amplifiers being coupled to a different antenna and receiving the presorted signal in a transmission array (101) (e.g., via gain/phase elements (106, 108, 110, 112); and a controller (132) controlling at least one of the power amplifiers (114, 124, 126 or 130) (e.g., the second power amplifier (116)) to intentionally introduce signal distortion into the pre-distorted signal (105) being amplified by said at least one power amplifier (116).

Device Embodiment 12. The communications device of Device Embodiment 11, wherein the said at least one of the power amplifiers is a second power amplifier in an array 113 of power amplifiers; and wherein the controller is configured to control (512) the second power amplifier (116) to intentionally introduce signal distortion includes controlling (516) one or more of: i) a bias voltage (212 or 213) supplied to a bias voltage input (213 or 219) of the second power amplifier (116), ii) a supply voltage (e.g., Vcc) (310) supplied to the second power amplifier (116), and iii) a non-linear control circuit (405) coupled to a signal input (4042), of the second power amplifier (116), to which the pre-distorted signal (105) is supplied.

Device Embodiment 12a. The communications device of Device Embodiment 12, wherein the second power amplifier (116) includes and bias voltage (213 or 219) input; and wherein controlling (512) the second power amplifier (116) to intentionally introduce signal distortion includes controlling (518) a bias voltage (212 or 218) supplied to a bias voltage input (213 or 219) of the second power amplifier (116).

Device Embodiment 12AC. The communications device of Device Embodiment 12a, wherein the bias voltage (212 or 218) is a DC bias voltage of the second power amplifier (116); and wherein controlling (518) the bias voltage (212 or 216) includes changing (519) the DC bias voltage as a function of the average operating power level of the second power amplifier (116).

Device Embodiment 12B. The communications device of Device Embodiment 12, wherein said step of controlling (512) the second power amplifier (116) to intentionally introduce signal distortion includes controlling (520) an operating voltage (e.g., Vcc) (312) supplied to the second power amplifier (116).

Device Embodiment 12C. The communications device of Device Embodiment 12, wherein the second power amplifier (116) includes a signal input (4042), and a non-linear control circuit (405); and wherein controlling (512) the second power amplifier (116) to intentionally introduce signal distortion includes controlling (522) a voltage produced by the non-linear control circuit (405) and supplied to the signal input (4042), of the second power amplifier (116) to which the pre-distorted signal (105) is also supplied.

Device Embodiment 13. The communications device of Device Embodiment 11, wherein the set of power amplifiers (114, 116, 118, 120) further includes a first power amplifier (114); and wherein the controller (132) is further configured to control (510) the first power amplifier (114) to intentionally introduce less signal distortion into the pre-distorted signal (105) being amplified by the first power amplifier than is intentionally introduced by the second power amplifier (116) or to control the first power amplifier (114) to amplify the pre-distorted signal (105) without the intentional introduction of signal distortion into pre-distorted signal (105) being amplified.

Device Embodiment 14. The communications device of Device Embodiment 13, wherein said set of power amplifiers (114, 116, 118, 120) further includes a third power amplifier (118) corresponding to a third transmission element (126), the third power amplifier (118) being driven at a third power level, said third power level being lower than said first and second power levels; and wherein said controller (132) is further configured to control the third power amplifier (118) to intentionally introduce signal distortion into the pre-distorted signal (105) being amplified by the third power amplifier (118).

Device Embodiment 15. The communications device of Device Embodiment 14, wherein the controller is configured, as part of controlling (514) the third power amplifier (118), to intentionally introduce signal distortion by controlling (524) one or more of: i) a bias voltage (212 or 218) supplied to a bias voltage input (213 or 219) of the third power amplifier (118), ii) a supply voltage (e.g., Vcc) (312) supplied to the third power amplifier (118), or iii) a non-linear control circuit (405) coupled to a signal input (4042) of the third power amplifier (118) to which the pre-distorted signal (105) is supplied.

Device Embodiment 16. The communications device of Device Embodiment 14, wherein the controller (132) is configured to control the third power amplifier (118) to intentionally introduce more signal distortion into the pre-distorted signal (105) being amplified by the third power amplifier than is intentionally introduced by the second power amplifier (118) or the first power amplifier (114).

Device Embodiment 17. The communications device of Device Embodiment 11, wherein said signal pre-distortion at least partially compensates for signal distortion unintentionally introduced by one or more to the power amplifiers in the transmission array (101).

Device Embodiment 18. The communications device of Device Embodiment 12, wherein the controller (132) controls the second power amplifier (116) based on the value of one or more power amplifier control parameters (150, 152, 154, 156); and wherein the controller (132) changes at least one of said one or more power amplifier control parameters (150, 152, 154, 156) in response to a change in average input power to the second power amplifier (116).

Device Embodiment 19. The communications device of Device Embodiment 18, wherein the controller (132) changes in the control of the second power amplifier (116) are implemented at a slower rate than a rate at which signal pre-distortion (105) implemented by the signal pre-distorter (104) is changed.

Device Embodiment 20. The communication device of Device Embodiment claim 12, wherein controller (132) drives the second power amplifier (116) at a power level that results in a higher error vector magnitude (EVM) and/or higher adjacent channel leakage ratio (ACLR) than would be introduced if the second power amplifier (116) operated at a higher power level; and wherein the pre-distorter (104) introduces signal distortion which cancels out at least some of the signal distortion introduced by operating the second power amplifier (116) at said power level.

In some embodiments the controller 132 is implemented as a microprocessor or other control circuit which may and sometimes does include a processor and memory as well as one or more instructions for controlling the controller 132 to generate the control signals discussed with regard to FIG. 1 and the other figures.

The techniques of various embodiments may be implemented using software, hardware and/or a combination of software and hardware. Various embodiments are directed to apparatus and/or systems, e.g., communications devices, wireless communications systems, wireless terminals, user equipment (UE) devices, access points, e.g., a WiFi wireless access point, a cellular wireless AP, e.g., an eNB or gNB, user equipment (UE) devices, a wireless cellular systems, e.g., a cellular system, WiFi networks, etc. Various embodiments are also directed to methods, e.g., method of controlling and/or operating a system or device, e.g., a communications system, an access point, a base station, a wireless terminal, a UE device, etc. Various embodiments are also directed to machine, e.g., computer, readable medium, e.g., ROM, RAM, CDs, hard discs, etc., which include machine readable instructions for controlling a machine to implement one or more steps of a method. The computer readable medium is, e.g., non-transitory computer readable medium.

It is understood that the specific order or hierarchy of steps in the processes and methods disclosed is an example of exemplary approaches. Based upon design preferences, it is understood that the specific order or hierarchy of steps in the processes and methods may be rearranged while remaining within the scope of the present disclosure. The accompanying method claims present elements of the various steps in a sample order, and are not meant to be limited to the specific order or hierarchy presented. In some embodiments, one or more processors are used to carry out one or more steps of the each of the described methods.

In various embodiments each of the steps or elements of a method are implemented using one or more processors. In some embodiments, each of elements or steps are implemented using hardware circuitry.

In various embodiments nodes and/or elements described herein are implemented using one or more components to perform the steps corresponding to one or more methods, for example, controlling, establishing, generating a message, message reception, signal processing, sending, communicating, e.g., receiving and transmitting, comparing, making a decision, selecting, making a determination, modifying, controlling determining and/or transmission steps. Thus, in some embodiments various features are implemented using components or in some embodiments logic such as for example logic circuits. Such components may be implemented using software, hardware or a combination of software and hardware. Many of the above described methods or method steps can be implemented using machine executable instructions, such as software, included in a machine readable medium such as a memory device, e.g., RAM, floppy disk, etc. to control a machine, e.g., general purpose computer with or without additional hardware, to implement all or portions of the above described methods, e.g., in one or more nodes. Accordingly, among other things, various embodiments are directed to a machine-readable medium, e.g., a non-transitory computer readable medium, including machine executable instructions for causing a machine, e.g., processor and associated hardware, to perform one or more of the steps of the above-described method(s). Some embodiments are directed to a device, e.g., a wireless communications device including a multi-element antenna array supporting beam forming, such as a cellular AP or Wifi AP, a wireless terminal, a UE device, etc., including a processor configured to implement one, multiple or all of the steps of one or more methods of the invention.

In some embodiments, the processor or processors, e.g., CPUs, of one or more devices, are configured to perform the steps of the methods described as being performed by the devices, e.g., communication nodes. The configuration of the processor may be achieved by using one or more components, e.g., software components, to control processor configuration and/or by including hardware in the processor, e.g., hardware components, to perform the recited steps and/or control processor configuration. Accordingly, some but not all embodiments are directed to a device, e.g., access point, with a processor which includes a component corresponding to each of the steps of the various described methods performed by the device in which the processor is included. In some but not all embodiments a device, e.g., wireless communications node such as an access point or base station, includes a component corresponding to each of the steps of the various described methods performed by the device in which the processor is included. The components may be implemented using software and/or hardware.

Some embodiments are directed to a computer program product comprising a computer-readable medium, e.g., a non-transitory computer-readable medium, comprising code for causing a computer, or multiple computers, to implement various functions, steps, acts and/or operations, e.g. one or more steps described above. Depending on the embodiment, the computer program product can, and sometimes does, include different code for each step to be performed. Thus, the computer program product may, and sometimes does, include code for each individual step of a method, e.g., a method of controlling a wireless communications device such as an access point. The code may be in the form of machine, e.g., computer, executable instructions stored on a computer-readable medium, e.g., a non-transitory computer-readable medium, such as a RAM (Random Access Memory), ROM (Read Only Memory) or other type of storage device. In addition to being directed to a computer program product, some embodiments are directed to a processor configured to implement one or more of the various functions, steps, acts and/or operations of one or more methods described above. Accordingly, some embodiments are directed to a processor, e.g., CPU, configured to implement some or all of the steps of the methods described herein. The processor may be for use in, e.g., a wireless communications device such as an access point described in the present application.

Numerous additional variations on the methods and apparatus of the various embodiments described above will be apparent to those skilled in the art in view of the above description. Such variations are to be considered within the scope. Numerous additional embodiments, within the scope of the present invention, will be apparent to those of ordinary skill in the art in view of the above description and the claims which follow. Such variations are to be considered within the scope of the invention.

What is claimed is:

1. A communications method, the method comprising:
    applying signal pre-distortion to a signal to be transmitted to distort the signal prior to transmission, the distorted signal being a pre-distorted signal;
    supplying the pre-distorted signal to power amplifiers in a transmission array, the power amplifiers in the transmission array including a first power amplifier corresponding to a first transmitter element and a second power amplifier corresponding to a second transmitter element, the first power amplifier being driven at a first power level, said second power amplifier being driven at a second power level lower than said first power level;
    controlling the second power amplifier to intentionally introduce signal distortion into the pre-distorted signal being amplified by the second power amplifier; and
    controlling the first power amplifier to intentionally introduce less signal distortion into the pre-distorted signal being amplified by the first power amplifier than is intentionally introduced by the second power amplifier or to control the first power amplifier to amplify the pre-distorted signal without the intentional introduction of signal distortion into pre-distorted signal being amplified.

2. The method of claim 1, wherein controlling the second power amplifier to intentionally introduce signal distortion includes controlling one or more of: i) a bias voltage supplied to a bias voltage input of the second power amplifier, ii) a supply voltage supplied to the second power amplifier, and iii) a non-linear control circuit coupled to a signal input, of the second power amplifier, to which the pre-distorted signal is supplied.

3. The method of claim 1, wherein said signal pre-distortion at least partially compensates for signal distortion unintentionally introduced by one or more to the power amplifiers in the transmission array.

4. The method of claim 1, wherein control of a third power amplifier is implemented based on one or more power amplifier control parameters, the method further comprising:
    changing at least one of said one or more power amplifier control parameters used to control the third power amplifier in response to a change in average input power to the third power amplifier.

5. The method of claim 1,
    wherein power amplifiers in said array are individually controlled and some power amplifiers are intentionally controlled to introduce distortions into the pre-distorted signal being amplified.

6. The method of claim 5, wherein the amount of intentional signal distortion introduced is increased the lower the power level at which the power amplifier is driven, power amplifiers driven at a lower power having more signal distortion intentionally introduced than power amplifiers driven at higher power levels.

7. A communications method, the method comprising:
    applying signal pre-distortion to a signal to be transmitted to distort the signal prior to transmission, the distorted signal being a pre-distorted signal;
    supplying the pre-distorted signal to power amplifiers in a transmission array, the power amplifiers in the transmission array including a first power amplifier corresponding to a first transmitter element and a second power amplifier corresponding to a second transmitter element, the first power amplifier being driven at a first power level, said second power amplifier being driven at a second power level lower than said first power level; and
    controlling the second power amplifier to intentionally introduce signal distortion into the pre-distorted signal being amplified by the second power amplifier;
    wherein controlling the second power amplifier to intentionally introduce signal distortion includes controlling one or more of: i) a bias voltage supplied to a bias voltage input of the second power amplifier, ii) a supply voltage supplied to the second power amplifier, and iii) a non-linear control circuit coupled to a signal input, of the second power amplifier, to which the pre-distorted signal is supplied; and
    wherein control of the second power amplifier is implemented based on one or more power amplifier control parameters, the method further comprising:
    changing at least one of said one or more power amplifier control parameters in response to a change in average input power to the second power amplifier.

8. The method of claim 7,
    wherein changes in the control of the second power amplifier are implemented at a slower rate than a rate at which signal pre-distortion implemented by a signal pre-distorter is changed.

9. A communications method, the method comprising:
applying signal pre-distortion to a signal to be transmitted to distort the signal prior to transmission, the distorted signal being a pre-distorted signal;
supplying the pre-distorted signal to power amplifiers in a transmission array, the power amplifiers in the transmission array including a first power amplifier corresponding to a first transmitter element and a second power amplifier corresponding to a second transmitter element, the first power amplifier being driven at a first power level, said second power amplifier being driven at a second power level lower than said first power level; and
controlling the second power amplifier to intentionally introduce signal distortion into the pre-distorted signal being amplified by the second power amplifier;
wherein controlling the second power amplifier to intentionally introduce signal distortion includes controlling one or more of: i) a bias voltage supplied to a bias voltage input of the second power amplifier, ii) a supply voltage supplied to the second power amplifier, and iii) a non-linear control circuit coupled to a signal input, of the second power amplifier, to which the pre-distorted signal is supplied;
wherein the second power amplifier is driven at a power level that results in a higher error vector magnitude (EVM) and/or higher adjacent channel leakage ratio (ACLR) than would be introduced if the second power amplifier operated at a higher power level; and
wherein a pre-distorter introduces signal distortion which cancels out at least some of the signal distortion introduced by operating the second power amplifier at said power level.

10. A communications device, comprising:
a digital signal predistorter controllably distorting a signal to be transmitted thereby producing a pre-distorted signal;
a plurality of antenna elements;
a set of power amplifiers arranged in parallel and being coupled to the digital signal predistorter, each of the power amplifiers in the set of power amplifiers being coupled to a different antenna element and receiving the pre-distorted signal in a transmission array; and
a controller controlling at least one of the power amplifiers to intentionally introduce signal distortion into the pre-distorted signal being amplified by said at least one power amplifier;
wherein the set of power amplifiers includes a first power amplifier; and
wherein the controller is further configured to control the first power amplifier to intentionally introduce less signal distortion into the pre-distorted signal being amplified by the first power amplifier than is intentionally introduced by a second power amplifier or to control the first power amplifier to amplify the pre-distorted signal without the intentional introduction of signal distortion into pre-distorted signal being amplified.

11. The communications device of claim 10, wherein said at least one of the power amplifiers is the second power amplifier in an array of power amplifiers;
and wherein the controller is configured to control the second power amplifier to intentionally introduce signal distortion, wherein controlling the second power amplifier to intentionally introduce signal distortion includes controlling one or more of: i) a bias voltage supplied to a bias voltage input of the second amplifier, ii) a supply voltage supplied to the second power amplifier, and iii) a non-linear control circuit coupled to a signal input, of the second power amplifier, to which the pre-distorted signal is supplied.

12. The communications device of claim 10, wherein said set of power amplifiers further includes a third power amplifier corresponding to a third transmission element, the third power amplifier being driven at a third power level, said third power level being lower than first and second power levels corresponding to said first and second power amplifiers respectively; and
wherein said controller is further configured to control the third power amplifier to intentionally introduce signal distortion into the pre-distorted signal being amplified by the third power amplifier.

13. The communications device of claim 12, wherein the controller is configured, as part of controlling the third power amplifier, to intentionally introduce signal distortion by controlling one or more of: i) a bias voltage supplied to a bias voltage input of the third power amplifier, ii) a supply voltage supplied to the third power amplifier, or iii) a non-linear control circuit coupled to a signal input of the third power amplifier to which the pre-distorted signal is supplied.

14. The communications device of claim 12, wherein the controller is configured to control the third power amplifier to intentionally introduce more signal distortion into the pre-distorted signal being amplified by the third power amplifier than is intentionally introduced by the second power amplifier or the first power amplifier.

15. The communications device of claim 10, wherein said signal pre-distortion at least partially compensates for signal distortion unintentionally introduced by one or more to the power amplifiers in the transmission array.

16. A communications device, comprising:
a digital signal predistorter controllably distorting a signal to be transmitted thereby producing a pre-distorted signal;
a plurality of antenna elements;
a set of power amplifiers arranged in parallel and being coupled to the digital signal predistorter, each of the power amplifiers in the set of power amplifiers being coupled to a different antenna element and receiving the pre-distorted signal in a transmission array; and
a controller controlling at least one of the power amplifiers to intentionally introduce signal distortion into the pre-distorted signal being amplified by said at least one power amplifier;
wherein said at least one of the power amplifiers includes a second power amplifier in an array of power amplifiers;
and wherein the controller is configured to control the second power amplifier to intentionally introduce signal distortion includes controlling one or more of: i) a bias voltage supplied to a bias voltage input of the second power amplifier, ii) a supply voltage supplied to the second power amplifier, and iii) a non-linear control circuit coupled to a signal input, of the second power amplifier, to which the pre-distorted signal is supplied; and
wherein the controller controls the second power amplifier based on the value of one or more power amplifier control parameters; and
wherein the controller changes at least one of said one or more power amplifier control parameters in response to a change in average input power to the second power amplifier.

17. The communications device of claim 16,
wherein the controller changes in the control of the second power amplifier are implemented at a slower rate than a rate at which signal pre-distortion implemented by the digital signal predistorter is changed.

18. A communications device, comprising:

a digital signal predistorter controllably distorting a signal to be transmitted thereby producing a pre-distorted signal;

a plurality of antenna elements;

a set of power amplifiers arranged in parallel and being coupled to the digital signal predistorter, each of the power amplifiers in the set of power amplifiers being coupled to a different antenna element and receiving the pre-distorted signal in a transmission array; and a controller controlling at least one of the power amplifiers to intentionally introduce signal distortion into the pre-distorted signal being amplified by said at least one power amplifier;

wherein said at least one of the power amplifiers includes a second power amplifier in an array of power amplifiers;

and wherein the controller is configured to control the second power amplifier to intentionally introduce signal distortion includes controlling one or more of: i) a bias voltage supplied to a bias voltage input of the second power amplifier, ii) a supply voltage supplied to the second power amplifier, and iii) a non-linear control circuit coupled to a signal input, of the second power amplifier, to which the pre-distorted signal is supplied; and wherein controller drives the second power amplifier at a power level that results in a higher error vector magnitude (EVM) and/or higher adjacent channel leakage ratio (ACLR) than would be introduced if the second power amplifier operated at a higher power level; and wherein the digital signal predistorter introduces signal distortion which cancels out at least some of the signal distortion introduced by operating the second power amplifier at said power level.

\* \* \* \* \*